(12) United States Patent
Cunha et al.

(10) Patent No.: US 11,561,267 B2
(45) Date of Patent: Jan. 24, 2023

(54) MAGNETIC SENSOR WITH ERROR SIGNALING CAPABILITY

(71) Applicant: Infineon Technologies AG, Neubiberg (DE)

(72) Inventors: Joao Cunha, Munich (DE); Christoph Oswald, Munich (DE); James Sterling, Novi, MI (US)

(73) Assignee: Infineon Technologies AG, Neubiberg (DE)

( * ) Notice: Subject to any disclaimer, the term of this patent is extended or adjusted under 35 U.S.C. 154(b) by 94 days.

(21) Appl. No.: 17/302,166

(22) Filed: Apr. 26, 2021

(65) Prior Publication Data

US 2022/0341764 A1    Oct. 27, 2022

(51) Int. Cl.
| | | |
|---|---|---|
| H04N 5/44 | (2011.01) | |
| G01R 33/00 | (2006.01) | |
| G01D 5/16 | (2006.01) | |

(52) U.S. Cl.
CPC ........... *G01R 33/0023* (2013.01); *G01D 5/16* (2013.01)

(58) Field of Classification Search
CPC .. G01R 33/0023; G01D 5/16; B60R 21/0136; B60R 2021/01027
See application file for complete search history.

(56) References Cited

U.S. PATENT DOCUMENTS

| | | | | |
|---|---|---|---|---|
| 3,781,664 A * | 12/1973 | Rorden | ................ | G01R 33/04 340/568.3 |
| 5,808,549 A * | 9/1998 | Shin | ................... | G08B 13/2408 340/572.6 |
| 6,407,660 B1 * | 6/2002 | Bomya | ............... | B60R 21/0136 340/436 |
| 6,587,048 B1 * | 7/2003 | Bomya | ............... | B60R 21/0136 280/735 |
| 6,631,776 B1 * | 10/2003 | Bomya | .................... | G01V 3/08 340/904 |
| 6,777,927 B1 * | 8/2004 | Bomya | ............... | B60R 21/0136 324/228 |
| 2004/0056652 A1 * | 3/2004 | Bomya | ................ | G01D 5/2046 340/436 |
| 2013/0181811 A1 * | 7/2013 | Mayor | ................... | G01V 3/087 340/6.1 |
| 2016/0253228 A1 | 9/2016 | Cha et al. | | |
| 2020/0004218 A1 | 1/2020 | Maier | | |

FOREIGN PATENT DOCUMENTS

| | | |
|---|---|---|
| KR | 20160049522 A | 5/2016 |
| WO | 2010150416 A1 | 12/2010 |

* cited by examiner

*Primary Examiner* — Munear T Akki
(74) *Attorney, Agent, or Firm* — Harrity & Harrity, LLP

(57) ABSTRACT

A magnetic sensor may include a comparator to receive a first signal indicating a strength of a magnetic field sensed by a first sensing component of the magnetic sensor, receive a second signal indicating a strength of a magnetic field sensed by a second sensing component of the magnetic sensor, perform an error check associated with the first sensing component and the second sensing component, the error check being performed based on the first signal and the second signal, and provide an indication of a result of the error check. The magnetic sensor may include a protocol encoder to receive the first signal, receive the indication of the result of the error check, and provide an output that includes the indication of the result of the error check.

20 Claims, 5 Drawing Sheets

| Error check | S1 | S2 | (S1+S2)/2 Comparator |
|---|---|---|---|
| A | 5 | -5 | 0 |
| B | 4 | -4 | 0 |
| C | 3 | -3 | 0 |
| D | 2 | -2 | 0 |
| E | 1 | -1 | 0 |
| F | 0 | 0 | 0 |
| G | -1 | 1 | 0 |
| H | -2 | 2 | 0 |
| I | -3 | 3 | 0 |
| J | -4 | 4 | 0 |
| K | -5 | 5 | 0 |
| L | 5 | -3 | 1 ← Error |
| M | 3 | -5 | -1 ← Error |

FIG. 4

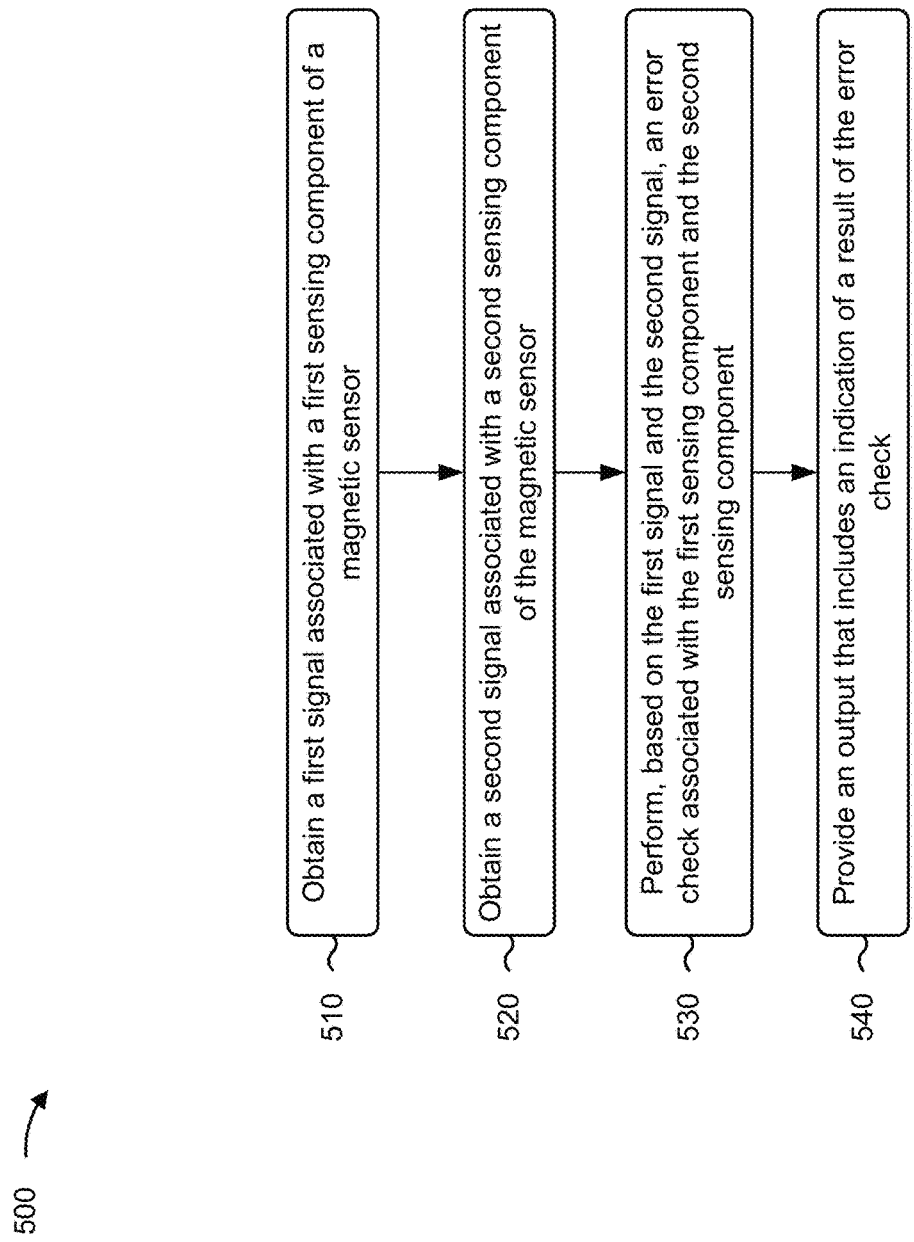

MAGNETIC SENSOR WITH ERROR SIGNALING CAPABILITY

BACKGROUND

A magnetic sensor may include one or more sensing components that sense a strength of a magnetic field (e.g., a magnetic field produced or distorted by a target object, a magnetic field generated by a current flow in a conductive path, or the like). The magnetic sensor may output, based on the sensed strength of the magnetic field, one or more signals that can be used, for example, for determining position information associated with the target object. The position information may include, for example, a linear position, an angular position, a position in three-dimensional (3D) space, a speed (e.g., a linear speed, an angular speed, or the like), or a direction of movement (e.g., a linear direction, a rotational direction, or the like), among other examples.

SUMMARY

In some implementations, a magnetic sensor includes a comparator to receive a first signal indicating a strength of a magnetic field sensed by a first sensing component of the magnetic sensor, receive a second signal indicating a strength of a magnetic field sensed by a second sensing component of the magnetic sensor, perform an error check associated with the first sensing component and the second sensing component, the error check being performed based on the first signal and the second signal, and provide an indication of a result of the error check; and a protocol encoder to receive the first signal, receive the indication of the result of the error check, and provide an output that includes the indication of the result of the error check.

In some implementations, a method includes obtaining, by a magnetic sensor, a first signal associated with a first sensing component of the magnetic sensor, obtaining, by the magnetic sensor, a second signal associated with a second sensing component of the magnetic sensor; performing, by the magnetic sensor and based on the first signal and the second signal, an error check associated with the first sensing component and the second sensing component; and providing, by the magnetic sensor, an output that includes an indication of a result of the error check.

In some implementations, a sensor includes one or more components to perform an error check based on a first signal associated with a first sensing component of the sensor and a second signal associated with a second sensing component of the sensor; and provide an output after performing the error check, wherein the output includes an indication of a result of the error check, and wherein the output does not include sensor information from the second signal.

BRIEF DESCRIPTION OF THE DRAWINGS

FIG. 4 is a diagram of an example illustrating detection of an error event by the magnetic sensor with error signaling capability described herein.

FIG. 5 is a flowchart of an example processes relating to operation of the magnetic sensor with error signaling capability described herein.

DETAILED DESCRIPTION

Figure 1:
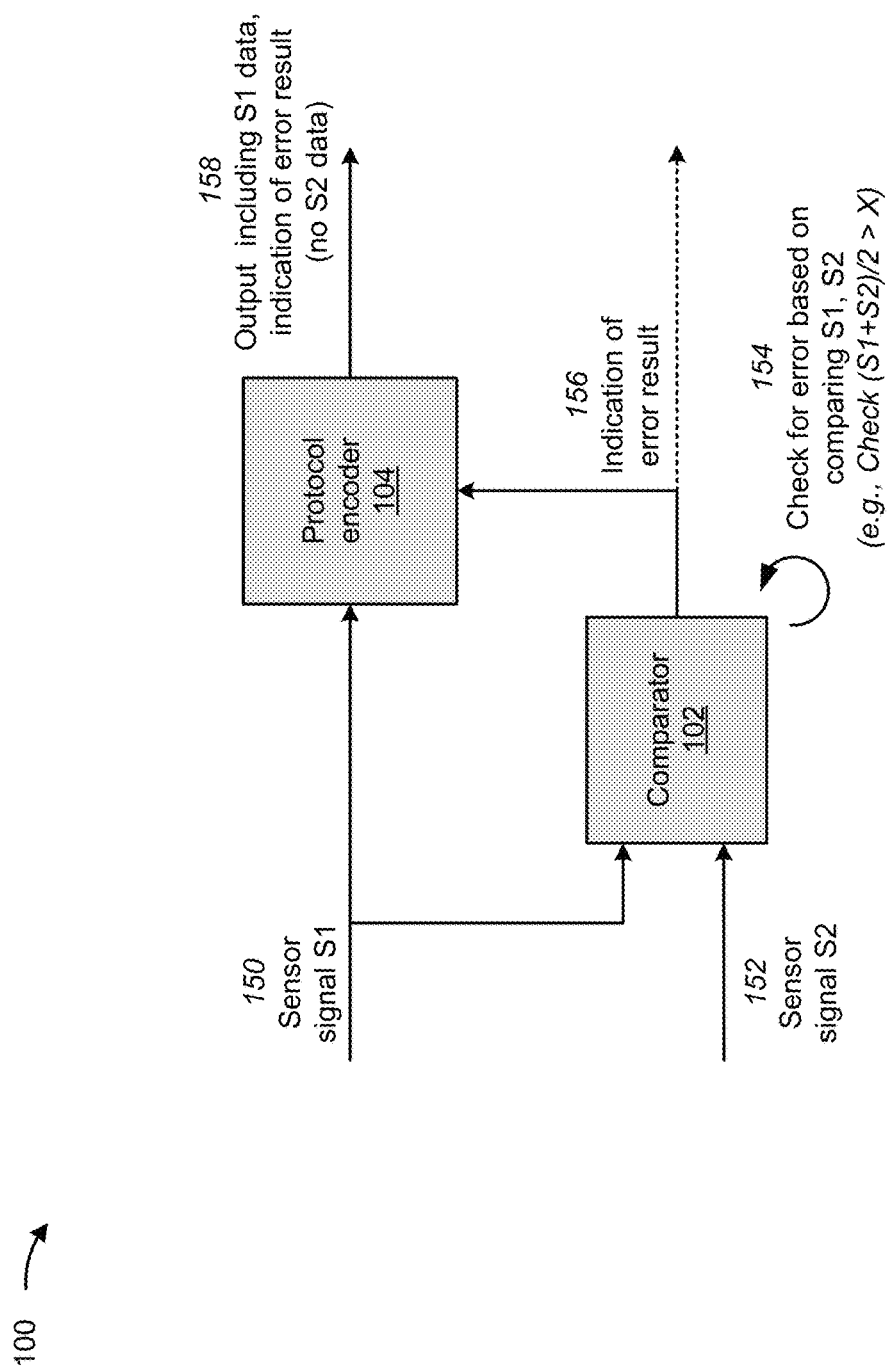
FIG. 1 is a diagram illustrating an example implementation of a magnetic sensor with error signaling capability described herein.

The following detailed description of example implementations refers to the accompanying drawings. The same reference numbers in different drawings may identify the same or similar elements.

A magnetic sensor may be utilized to determine position information associated with a target object in a given application. For example, a Hall-based sensor (e.g., a magnetic sensor comprising one or more sensing components that operate based on the Hall effect) may be utilized for linear and/or angular position sensing in an automotive application, such as a pedal position application, a suspension control application, a throttle position application, a headlight levelling application, or a steering torque sensing application, among other examples. In some applications, it is desired or required to ensure functional safety of the magnetic sensor.

In general, functional safety can be defined as an absence of unreasonable risk (e.g., to a system, to an environment, to people, and/or the like) due to hazards caused by malfunctioning behavior (e.g., a systematic failure, a random failure, or the like) of the magnetic sensor. In the automotive context, an Automotive Safety Integrity Level (ASIL) scheme may be used to dictate functional safety requirements for a magnetic sensor. The ASIL scheme is a risk classification scheme defined by the International Organization for Standardization (ISO) 26262 standard (titled Functional Safety for Road Vehicles), which provides a standard for functional safety of electrical and/or electronic systems in production automobiles. An ASIL classification defines safety requirements necessary to be in line with the ISO 26262 standard. An ASIL is established by performing a risk analysis of a potential hazard by looking at severity, exposure, and controllability of a vehicle operating scenario. A safety goal for that hazard in turn carries the ASIL requirements. There are four ASILs identified by the standard: ASIL A, ASIL B, ASIL C, and ASIL D. ASIL D dictates the highest integrity requirements, while ASIL A dictates the lowest. A hazard with a risk that is low (and, therefore, does not require safety measures in accordance with ISO 26262) is identified as quality management (QM). In some cases, it is desirable or required that a magnetic sensor achieves a high ASIL. For example, it may be desirable or required that a magnetic sensor used in a steering torque sensing application achieves ASIL D. To ensure functional safety in a magnetic sensor, a safety mechanism that allows malfunctioning behavior to be identified and signaled should be implemented.

In some cases, a magnetic sensor includes two channels in order to enable error checking or redundancy in association with ensuring functional safety of a particular level. Generally, each of the two channels includes a separate sensing component, and the two sensing components are arranged near one another (e.g., such that the two sensing components are at essentially the same location). Typically, the magnetic sensor provides outputs of both of the channels to a controller (e.g., a microcontroller (μc), an electronic control unit (ECU), or the like). The controller receives the outputs and then compares the outputs to one another. Here, if the controller determines that one output differs from the other output by more than some threshold amount, then the controller determines that at least one of the channels is experiencing an error (e.g., that at least one of the channels is delivering unreliable, incorrect, or inaccurate sensor data).

Notably, the comparison of the outputs of the two channels of the magnetic sensor is performed external to the magnetic sensor (e.g., is performed by the controller). Therefore, the magnetic sensor needs to provide the outputs for both of the channels in order to enable the comparison. However, the external comparison, and the need to provide the outputs of both channels in association with performing the external comparison, is undesirable. For example, the external comparison, and the need to provide both of the outputs to perform the comparison externally, results in a delay in association with performing the comparison and, therefore, results in a delay in association with detecting a malfunctioning behavior. As another example, the need to provide both of the outputs results in wasted resources at the sensor level (e.g., processing resources, battery power, or the like) and/or wasted resources at the system level (e.g., network resources, bus resources, or the like).

Some implementations described herein provide a magnetic sensor with error signaling capability. In some implementations, the magnetic sensor includes a comparator that receives a first signal indicating a strength of a magnetic field sensed by a first sensing component of the magnetic sensor, and receives a second signal indicating a strength of a magnetic field sensed by a second sensing component of the magnetic sensor. In some implementations, the comparator performs an error check associated with the first sensing component and the second sensing component based on the first signal and the second signal, and provides an indication of a result of the error check. In some implementations, the magnetic sensor includes a protocol encoder that receives the first signal and the indication of the result of the error check, and provides an output that includes (at least) the indication of the result of the error check. Additional details regarding the magnetic sensor with error signaling capability are provided below.

Notably, according to the implementations described herein, an error check associated with the sensing components of the magnetic sensor is performed by the magnetic sensor itself (e.g., rather than by a controller), meaning that the magnetic sensor need not provide outputs of both channels of the magnetic sensor. Here, performing the error check at the magnetic sensor (e.g., rather than at the controller) reduces a delay in association with performing the error check and, therefore, reduces a delay in association with detecting a malfunctioning behavior. Further, the elimination of the need to provide both of the outputs reduces an amount of resources wasted at the sensor level (e.g., processing resources, battery power, or the like) and/or at the system level (e.g., network resources, bus resources, or the like).

FIG. 1 is a diagram illustrating an example implementation of a magnetic sensor 100 with error signaling capability. As shown in FIG. 1, the magnetic sensor 100 may include a comparator 102 and a protocol encoder 104. Details of the comparator 102 and the protocol encoder 104 are provided below, followed by a description of an example operation of the magnetic sensor 100.

The comparator 102 includes one or more components capable of comparing signals associated with the sensing components of the magnetic sensor 100 in association with performing an error check for the sensing components of the magnetic sensor 100. For example, the comparator 102 may include a component that compares two input signals (e.g., voltage signals or current signals) and provides an output signal (e.g., a digital signal) indicating a result of the comparison.

The protocol encoder 104 includes one or more components capable of receiving one or more signals, generating a protocol-based message based on the one or more signals, and providing an output that carries the protocol-based message. For example, the protocol encoder 104 may include a component that receives a signal associated with a sensing component of the magnetic sensor 100 and receives an indication of a result of an error check performed by the comparator 102. Here, the protocol encoder 104 may generate a protocol-based message based on the indication of the error result and the signal associated with the sensing component (e.g., such that the protocol-based message carries the indication and sensor information from the signal), and may provide the protocol-based message as an output of the protocol encoder 104. In some implementations, the protocol-based message may be generated or provided according to, for example, a short pulse-width modulation code (SPC) protocol, a peripheral sensor interface 5 (PSI5) protocol, or another type of communication protocol.

In operation of the magnetic sensor 100, as shown by reference 150 in FIG. 1, the comparator 102 receives a first signal (e.g., sensor signal S1). Here, the first signal is associated with a first sensing component of the magnetic sensor 100. That is, the first signal may indicate a strength of a magnetic field sensed by the first sensing component of the magnetic sensor 100. In some implementations, the comparator 102 receives the first signal from a component associated with a first channel of the magnetic sensor 100 (e.g., an analog-to-digital converter (ADC) configured to convert an analog signal provided by the first sensing component to a digital signal). As shown, the first signal may also be provided to the protocol encoder 104.

Similarly, as shown by reference 152, the comparator 102 receives a second signal (e.g., sensor signal S2). Here, the second signal is associated with a second sensing component of the magnetic sensor 100. That is, the second signal may indicate a strength of a magnetic field sensed by the second sensing component of the magnetic sensor 100. In some implementations, the comparator 102 receives the second signal from a component associated with a second channel of the magnetic sensor 100 (e.g., an ADC configured to convert an analog signal provided by the second sensing component to a digital signal).

As shown by reference 154, the comparator 102 may perform an error check associated with the first sensing component and the second sensing component, where the error check is performed based on the first signal and the second signal. For example, to perform the error check, the comparator 102 may first calculate a difference value based on the first signal and the second signal. The difference value is a value indicative of a difference between the first signal and the second signal (e.g., a difference between the strength of the magnetic field sensed by the first sensing component and a strength of a magnetic field sensed by the second sensing component). As one example, as indicated in FIG. 1, the comparator 102 may halve a result of adding the first signal and the second signal (e.g., (S1+S2)/2), a result of which may be the difference value. Next, the comparator 102 may determine whether the difference value satisfies a threshold X (e.g., whether (S1+S2)/2>X). Here, if the comparator 102 determines that the difference value satisfies the threshold X (e.g., that (S1+S2)/2>X), then the comparator 102 may determine that an error event has occurred (e.g., that the magnetic sensor 100 is exhibiting a malfunctioning behavior). Conversely, if the comparator 102 determines that the difference value does not satisfy the threshold X (e.g., that (S1+S2)/2≤X), then the comparator 102 may determine that an error event has not occurred (e.g., that the magnetic sensor 100 is not exhibiting a malfunctioning behavior).

In some implementations, the threshold X may be configured on the magnetic sensor 100 (e.g., stored in a memory of the magnetic sensor 100, with the memory being accessible by the comparator 102). In some implementations, the threshold X may be configured on the magnetic sensor 100 during manufacturing of the magnetic sensor 100, and/or during calibration of the magnetic sensor 100. Additionally, or alternatively, the threshold X may be configured on the magnetic sensor 100 by a controller associated with the magnetic sensor 100 (e.g., a pc or an ECU with which the magnetic sensor 100 is configured to communicate).

In some implementations, as shown by reference 156, the comparator 102 provides an indication of a result of the error check. The indication of the result of the error check is an indication of whether the magnetic sensor 100 has detected an occurrence of an error event. As shown in FIG. 1, the comparator 102 in some implementations provides the indication of the result of the error check to the protocol encoder 104 to enable the protocol encoder 104 to provide an output including the indication of the result of the error check.

As further shown in FIG. 1, in some implementations, the protocol encoder 104 receives the first signal and the indication of the result of the error check and, as shown by reference 158, provides an output that includes the indication of the result of the error check. That is, the protocol encoder 104 may receive the first signal and the indication of the result of the error check, and may generate and provide an output that includes at least the indication of the result of the error check. In some implementations, the indication of the result of the error check is carried in one or more bits of the output. For example, the indication of the result of the error check may be carried in a single bit of a protocol-based message generated by the protocol encoder 104.

In some implementations, the output includes sensor information from the first signal and does not include sensor information from the second signal. For example, the result of the error check may include a determination that an error event has not occurred. In such a case, the protocol encoder 104 may generate a protocol-based message that includes the indication of the result of the error check (e.g., a bit with a value indicating that no occurrence of an error event was detected) and sensor information (e.g., one or more bits of sensor data) from the first signal. Notably, in this example, the output does not include sensor information from the second signal, meaning that the protocol encoder 104 can generate and provide the protocol-based message comparatively faster and using comparatively fewer resources (e.g., as compared to generating and providing a protocol-based message that carries sensor information associated with the first signal and sensor information associated with the second signal).

As another example, the result of the error check may include a determination that an error event has occurred. In such a case, the protocol encoder 104 may in some implementations generate a protocol-based message that includes the indication of the result of the error check (e.g., a bit with a value indicating that an occurrence of an error event was detected) and sensor information from the first signal. Notably, in this example, the output does not include sensor information from the second signal, meaning that the protocol encoder 104 can generate and provide the protocol-based message comparatively faster and using comparatively fewer resources (e.g., as compared to generating and providing a protocol-based message that carries sensor information associated with the first signal and sensor information associated with the second signal). In this example, the protocol encoder 104 may in some implementations provide (at a later time) another output including the sensor information from the second signal (e.g., to permit the controller to verify the error event based on the first signal and the second signal). In such a case, the protocol encoder 104 may provide the other output based on a request to provide the sensor information from the second signal (e.g., a request received from the controller) or may be configured to provide the sensor information from the second signal automatically (e.g., without a request from the controller), depending on a configuration of the magnetic sensor 100.

In some implementations, the output does not include sensor information from the first signal or sensor information from the second signal. For example, the result of the error check may include a determination that an error event has occurred. In such a case, the protocol encoder 104 may generate a protocol-based message that includes the indication of the result of the error check (e.g., a bit with a value indicating that an occurrence of an error event was detected). Notably, in this example, the output does not include sensor information from the first signal or sensor information from the second signal, meaning that the protocol encoder 104 can generate and provide the protocol-based message comparatively faster and using comparatively fewer resources (e.g., as compared to generating and providing a protocol-based message that carries sensor information from the first signal and/or sensor information from the second signal).

In some implementations, as described above, the comparator 102 provides the indication of the result of the error check to the protocol encoder 104, and the protocol encoder 104 generates and provides a protocol-based message including one or more bits carrying the indication of the result of the error check. In some implementations, in order to further reduce a delay of signaling an error, the indication of the result of the error check may be provided as an output of the magnetic sensor 100 without generation of a protocol-based message. For example, in some implementations, the magnetic sensor 100 may include a pin dedicated to error signaling by the magnetic sensor 100. Here, if the comparator 102 determines that an error event has occurred, then the comparator 102 may provide the indication of the result of the error check (i.e., an indication that a malfunctioning behavior has been detected) via the dedicated error pin (e.g., by changing a level of a signal on the dedicated error pin). That is, the comparator 102 may provide the indication of the result of the error check via a signal provided via an error pin associated with dedicated error signaling. In such an implementation, an amount of time needed to signal an error is further reduced (e.g., since a protocol-based message need not be generated and provided). Further, in such an implementation, a signal on the dedicated error pin may be set to active low, which enables a broken or unpowered magnetic sensor 100 to be readily detected by the controller.

As another example, the magnetic sensor 100 includes an output pin associated with transmitting sensor data (e.g., a pin via which the protocol encoder 104 provides protocol-based messages). In some implementations, if the comparator 102 determines that an error event has occurred, then the comparator 102 may provide the indication of the result of the error check via the output pin (e.g., by changing a level of a signal on the output pin for a particular amount of time).

That is, the comparator 102 may provide the indication of the result of the error check via a signal provided via the output pin associated with transmitting sensor data, in some implementations.

As indicated above, FIG. 1 is provided as an example. Other examples may differ from what is described with regard to FIG. 1. The number and arrangement of components shown in FIG. 1 are provided as an example. In practice, there may be additional components, fewer components, different components, or differently arranged components than those shown in FIG. 1. Furthermore, two or more components shown in FIG. 1 may be implemented within a single component, or a single component shown in FIG. 1 may be implemented as multiple, distributed components. Additionally, or alternatively, a set of components (e.g., one or more components) shown in FIG. 1 may perform one or more functions described as being performed by another set of components shown in FIG. 1.

Figure 2:
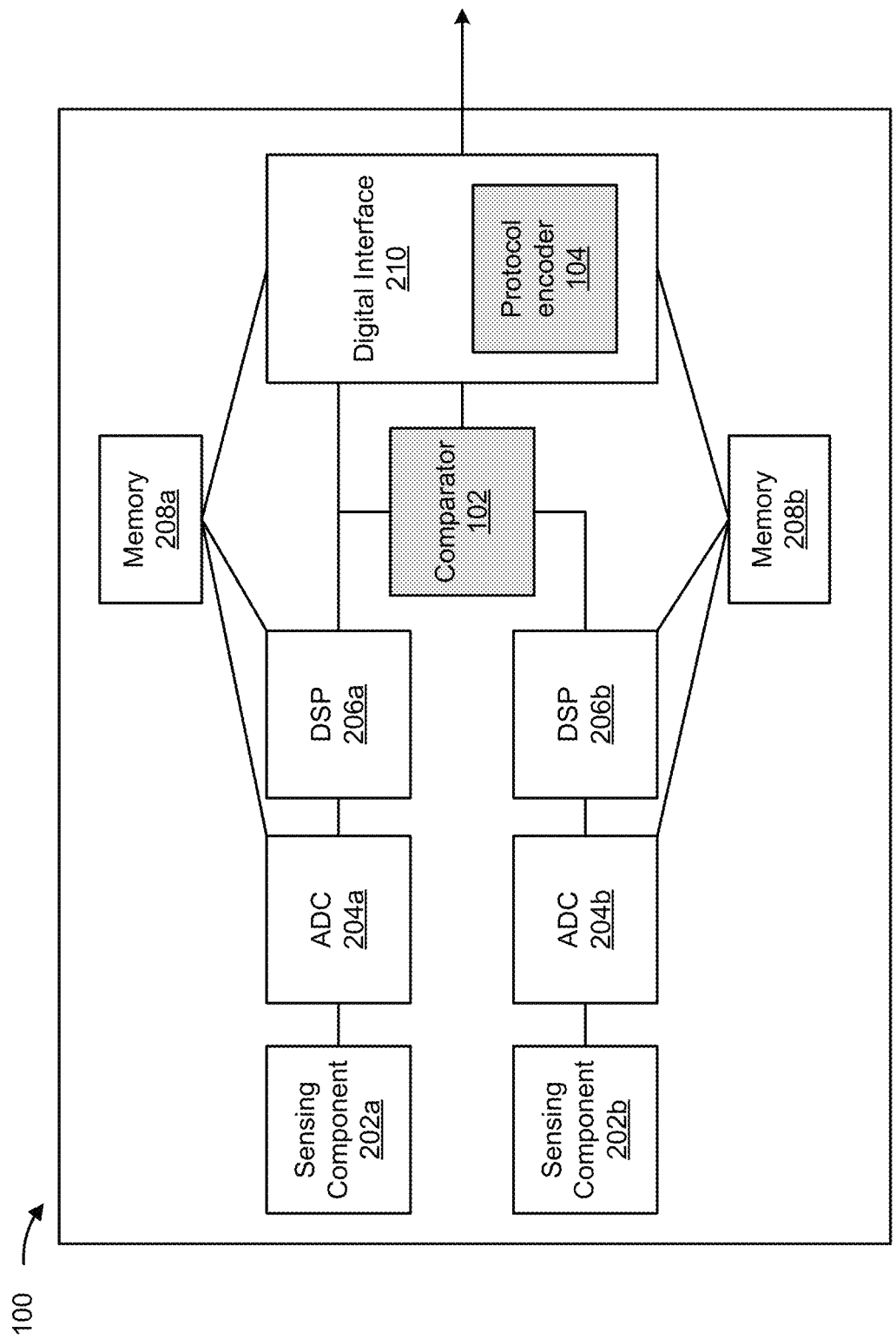
FIG. 2 is a diagram of example components of the magnetic sensor with error capability signaling described herein.

FIG. 2 is a diagram of example components of the magnetic sensor 100. As shown, magnetic sensor 100 may include the comparator 102, the protocol encoder 104, a sensing component 202a, a sensing component 202b, an ADC 204a, an ADC 204b, a digital signal processor (DSP) 206a, a DSP 206b, a memory 208a, a memory 208b, and a digital interface 210. In some implementations, the magnetic sensor 100 may be a dual-die, single-channel sensor (e.g., a sensor comprising two semiconductor dies, each including components that form a single sensor signal channel). In some implementations, the magnetic sensor 100 may be a single-die, multi-channel sensor (e.g., a sensor comprising a single semiconductor die includes components forming multiple sensor channels).

The sensing component 202 (e.g., sensing component 202a, sensing component 202b) includes one or more components for sensing a magnetic field at magnetic sensor 100. For example, sensing component 202 may include one or more Hall-based sensing elements that operate based on a Hall-effect. As another example, sensing component 202 may include one or more magnetoresistive (MR) based sensing elements, elements of which are comprised of a magnetoresistive material (e.g., nickel-iron (NiFe)), where the electrical resistance of the magnetoresistive material may depend on a strength and/or a direction of the magnetic field present at the magnetoresistive material. Here, sensing component 202 may operate based on an anisotropic magnetoresistance (AMR) effect, a giant magnetoresistance (GMR) effect, a tunnel magnetoresistance (TMR) effect, and/or the like. As an additional example, sensing component 202 may include one or more variable reluctance (VR) based sensing elements that operate based on induction. In some implementations, sensing component 202 may provide an analog signal, corresponding to the magnetic field, to ADC 204.

ADC 204 (e.g., ADC 204a, ADC 204b) includes an analog-to-digital converter that converts an analog signal from the sensing component 202 to a digital signal. For example, ADC 204 may convert analog signals, received from the sensing component 202, into digital signals to be processed by an associated DSP 206. ADC 204 may provide the digital signals to DSP 206. In some implementations, magnetic sensor 100 may include one or more ADCs 204.

DSP 206 (e.g., DSP 206a, DSP 206b) includes a digital signal processing device or a collection of digital signal processing devices. In some implementations, DSP 206 may receive digital signals from ADC 204 and may process the digital signals to form signals, such as signals used to determine a position of a target object as sensed by the magnetic sensor 100.

Memory 208 (e.g., memory 208a, memory 208b) is an optional memory. In some implementations, the memory 208 includes a read only memory (ROM) (e.g., an EEPROM), a random access memory (RANI), and/or another type of dynamic or static storage device (e.g., a flash memory, a magnetic memory, an optical memory, and/or the like) that stores information and/or instructions for use by magnetic sensor 100. In some implementations, optional memory 208 may store information associated with processing performed by DSP 206, error checking to be performed by the comparator 102, message generation to be performed by the protocol encoder 104, or the like. Additionally, or alternatively, optional memory 208 may store configurational values or parameters for the sensing component 202 and/or information for one or more other components of magnetic sensor 100, such as ADC 204 or digital interface 210.

Digital interface 210 includes an interface via which magnetic sensor 100 may receive and/or provide information from and/or to another device, such as a controller (not shown). For example, digital interface 210 may provide an output (i.e., an output signal), determined by DSP 206 or the comparator 102, to the controller and may further receive information from the controller. In some implementations, as shown in FIG. 2, digital interface 210 may include the protocol encoder 104 described herein.

As indicated above, FIG. 2 is provided as an example. Other examples may differ from what is described with regard to FIG. 2. The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 may perform one or more functions described as being performed by another set of components shown in FIG. 2.

Figure 3A:
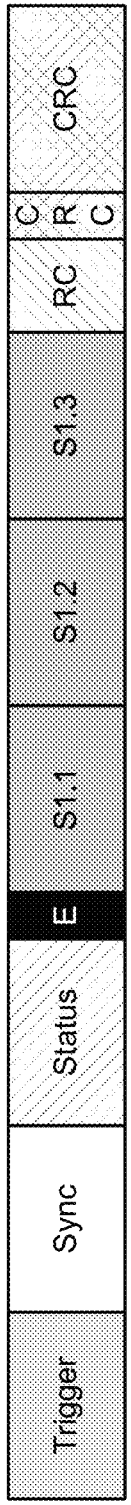
FIGS. 3A and 3B are diagrams of example short pulse-width modulation based messaging that can be used by the magnetic sensor with error signaling capability described herein.
Figure 3B:
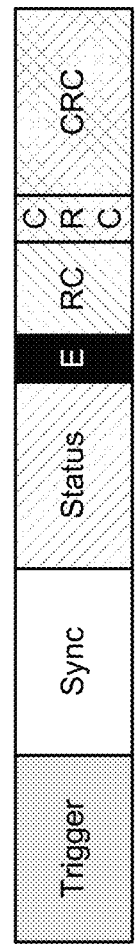

In some implementations, as described above, an output generated and provided by the protocol encoder 104 includes an indication of a result of an error check performed by the comparator 102 and, in some cases, includes sensor information from the first signal associated with the first sensing component (e.g., sensing component 202a) of the magnetic sensor 100. FIGS. 3A and 3B are diagrams of example SPC-based messaging that can be utilized by the magnetic sensor 100 in association with providing the output generated by the protocol encoder 104 as described herein.

FIG. 3A is a diagram of an example for an output that includes the indication of the result of an error check and the sensor information from the first signal. As shown in FIG. 3A, a trigger pulse (e.g., transmitted by the controller) initiates message transmission, followed by a synchronization period. Next, the magnetic sensor 100 provides a set of bits (e.g., four bits) carrying sensor status data (e.g., a sensor identifier, short serial messaging data, or the like), which is followed by a one bit error indication (e.g., the indication of the result of the error check), and then one or more sets of bits (e.g., three sets of bits) of sensor information from the first signal (e.g., four bits in S1.1, four bits in S1.2, and four bits in S1.3). Next, the magnetic sensor 100 may provide a set of bits (e.g., two bits) associated with a rolling counter (RC), followed by a set of bits (e.g., 5 bits) associated with a cyclic redundancy check (CRC). Here, with a unit time (UT) of 2 microseconds (μs), a total message time may be approximately 544 μs in normal operation, and approximately 640 μs in a worst case.

FIG. 3B is a diagram of an example for an output that includes the indication of the result of an error check. As shown in FIG. 3B, a trigger pulse (e.g., transmitted by the controller) initiates message transmission, followed by a synchronization period. Next, the magnetic sensor 100 provides a set of bits (e.g., four bits) carrying sensor status data (e.g., a sensor identifier, short serial messaging data, or the like), which is followed by a one bit error indication (e.g., the indication of the result of the error check). Next, the magnetic sensor 100 may provide a set of bits (e.g., two bits) associated with an RC, followed by a set of bits (e.g., 5 bits) associated with a CRC. Here, with a UT of 2 μs, a total message time may be approximately 430 μs in normal operation, and approximately 478 μs in a worst case.

Notably, in the examples shown in FIGS. 3A and 3B, the magnetic sensor 100 does not provide sensor information for the second signal associated with the second sensing component. As a result, an amount of time or resources wasted at the sensor level (e.g., processing resources, battery power, or the like) and/or at the system level (e.g., network resources, bus resources, or the like) in association with error signaling is reduced. For example, in a case where a magnetic sensor is configured to provide sensor information for a first signal and sensor information for a second signal (e.g., to permit a controller to perform an error check), an SPC-based message, with a UT of 2μs, may have a total message time of approximately 609 μs in normal operation and approximately 748 μs in a worst case.

As indicated above, FIGS. 3A and 3B are provided as examples. Other examples may differ from what is described with regard to FIGS. 3A and 3B.

In some implementations, as described above, the comparator 102 may perform an error check associated with the first sensing component (e.g., the sensing component 202a) and the second sensing component (e.g., the sensing component 202b) based on a first signal associated with the first sensing component and a second signal associated with the second sensing component. FIG. 4 is a diagram of an example illustrating detection of an error event by the magnetic sensor 100.

In FIG. 4, each row includes values associated with an error check identified in the "Error check" column. For example, for error check A the first signal has a value of 5 (identified in column S1), while the second signal has a value of −5 (identified in column S2). Here, a given value may correspond to a voltage of a signal, a current of the signal, or some other characteristic of the signal. Here, as shown in the rightmost column of FIG. 4, the comparator 102 may perform a given error check by first calculating a difference value based on the first signal and the second signal. Taking error check A as an example, the comparator 102 calculates the difference value as 0 (e.g., (S1+S2)/2= (5+−5)/2=0). In this example, the threshold X based on which the comparator 102 checks for error events is set to 0. Thus, with respect to error check A, the comparator 102 determines that the difference value does not satisfy the threshold X (e.g., that (S1+S2)/2≤X) and, therefore, determines that an error event has not occurred (e.g., that the magnetic sensor 100 is not exhibiting a malfunctioning behavior). The comparator 102 may repeat this process to perform further error checks (e.g., error checks B through K) with a similar result.

However, with respect to error check L, the first signal has a value of 5, while the second signal has a value of −3. As shown in the rightmost column of FIG. 4, the comparator 102 calculates the difference value as 1 (e.g., (S1+S2)/2= (5+−3)/2=1). Thus, the comparator 102 determines that the difference value satisfies the threshold X (e.g., that (S1+S2)/2>X) and, therefore, determines that an error event has occurred (e.g., that the magnetic sensor 100 is exhibiting a malfunctioning behavior). A similar result is shown for error check M.

As indicated above, FIG. 4 is provided as an example. Other examples may differ from what is described with regard to FIG. 4.

FIG. 5 is a flowchart of an example process 500 relating to operation of a magnetic sensor with error capability signaling. In some implementations, one or more process blocks of FIG. 5 may be performed by a magnetic sensor (e.g., magnetic sensor 100). In some implementations, one or more process blocks of FIG. 5 may be performed by one or more components of the magnetic sensor 100, such as the comparator 102, the protocol encoder 104, the sensing component 202a, the sensing component 202b, the ADC 204a, the ADC 204b, the DSP 206a, the DSP 206b, the memory 208a, the memory 208b, and/or the digital interface 210.

As shown in FIG. 5, process 500 may include obtaining a first signal associated with a first sensing component of the magnetic sensor (block 510). For example, the magnetic sensor (e.g., the comparator 102) may obtain a first signal associated with a first sensing component (e.g., the sensing component 202a) of the magnetic sensor, as described above.

As shown in FIG. 5, process 500 may include obtaining a second signal associated with a second sensing component of the magnetic sensor (block 520). For example, the magnetic sensor (e.g., the comparator 102) may obtain a second signal associated with a second sensing component (e.g., the sensing component 202b) of the magnetic sensor, as described above.

As further shown in FIG. 5, process 500 may include performing, based on the first signal and the second signal, an error check associated with the first sensing component and the second sensing component (block 530). For example, the magnetic sensor (e.g., the comparator 102) may perform, based on the first signal and the second signal, an error check associated with the first sensing component and the second sensing component, as described above.

As further shown in FIG. 5, process 500 may include providing an output that includes an indication of a result of the error check (block 540). For example, the magnetic sensor (e.g., the comparator 102, the protocol encoder 104) may provide an output that includes an indication of a result of the error check, as described above.

Process 500 may include additional implementations, such as any single implementation or any combination of implementations described below and/or in connection with one or more other processes described elsewhere herein.

In a first implementation, the output includes sensor information from the first signal and does not include sensor information from the second signal when the result of the error check is a determination that an error event has not occurred.

In a second implementation, the output does not include sensor information from the first signal or sensor information from the second signal when the result of the error check is a determination that an error event has occurred.

In a third implementation, the output includes sensor information from the first signal and does not include sensor information from the second signal when the result of the error check includes a determination that an error event has occurred.

In a fourth implementation, the output is a protocol-based message that comprises one or more bits carrying the indication of the result of the error check.

In a fifth implementation, the output is provided via an error pin associated with dedicated error signaling.

In a sixth implementation, performing the error check comprises determining a threshold associated with detecting an occurrence of an error event, calculating a difference value based on the first signal and the second signal, and determining whether an error event has occurred based on comparing the difference value to the threshold.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, and/or a combination of hardware and software. It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items,), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A magnetic sensor, comprising:
 a comparator to:
  receive a first signal indicating a strength of a magnetic field sensed by a first sensing component of the magnetic sensor,
  receive a second signal indicating a strength of a magnetic field sensed by a second sensing component of the magnetic sensor,
  perform an error check associated with the first sensing component and the second sensing component, the error check being performed based on the first signal and the second signal, and
  provide an indication of a result of the error check; and
 a protocol encoder to:
  receive the first signal,
  receive the indication of the result of the error check, and
  provide an output that includes the indication of the result of the error check.

2. The magnetic sensor of claim 1, wherein the output includes sensor information from the first signal and does not include sensor information from the second signal when the result of the error check includes a determination that an error event has not occurred.

3. The magnetic sensor of claim 1, wherein the output does not include sensor information from the first signal or sensor information from the second signal when the result of the error check is a determination that an error event has occurred.

4. The magnetic sensor of claim 1, wherein the output includes sensor information from the first signal and does not include sensor information from the second signal when the result of the error check includes a determination that an error event has occurred.

5. The magnetic sensor of claim 1, wherein the result of the error check is a determination that an error event has occurred and the output is a first output, and the protocol encoder is further to provide a second output including at least one of sensor information from the first signal or sensor information from the second signal.

6. The magnetic sensor of claim 5, wherein the second output is provided based on a request to provide the at least one of the sensor information from the first signal or the sensor information from the second signal.

7. The magnetic sensor of claim 1, wherein the output comprises a single bit that carries the indication of the result of the error check.

8. The magnetic sensor of claim 1, wherein the comparator, when performing the error check, is to:
 calculate a difference value based on the first signal and the second signal, determine whether the difference value satisfies a threshold, and determine whether an error event has occurred based on whether the difference value satisfies the threshold.

9. A method, comprising:

obtaining, by a comparator associated with a magnetic sensor, a first signal associated with indicating a strength of a magnetic field sensed by a first sensing component of the magnetic sensor, obtaining, by the comparator, a second signal associated with indicating a strength of a magnetic field sensed by a second sensing component of the magnetic sensor;

performing, by the comparator and based on the first signal and the second signal, an error check associated with the first sensing component and the second sensing component;

providing, by the comparator, an indication of a result of the error check;

receiving, by a protocol encoder associated with the magnetic sensor, the first signal;

receiving, by the protocol encoder, the indication of the result of the error check; and providing, by the protocol encoder, an output that includes an indication of a result of the error check.

10. The method of claim 9, wherein the output includes sensor information from the first signal and does not include sensor information from the second signal when the result of the error check is a determination that an error event has not occurred.

11. The method of claim 9, wherein the output does not include sensor information from the first signal or sensor information from the second signal when the result of the error check is a determination that an error event has occurred.

12. The method of claim 9, wherein the output includes sensor information from the first signal and does not include sensor information from the second signal when the result of the error check includes a determination that an error event has occurred.

13. The method of claim 9, wherein the output is a protocol-based message that comprises one or more bits carrying the indication of the result of the error check.

14. The method of claim 9, wherein the output is provided via an error pin associated with dedicated error signaling.

15. The method of claim 9, wherein performing the error check comprises:

determining a threshold associated with detecting an occurrence of an error event;

calculating a difference value based on the first signal and the second signal; and determining whether an error event has occurred based on comparing the difference value to the threshold.

16. A sensor, comprising:

a comparator to:
receive a first signal indicating a strength of a magnetic field sensed by a first sensing component of the sensor,
receive a second signal indicating a strength of a magnetic field sensed by a second sensing component of the sensor,
perform an error check based on the first signal and the second signal, and
provide an indication of a result of the error check; and a protocol encoder to:
receive the first signal,
receive the indication of the result of the error check, and
provide an output after performing the error check, wherein the output includes an indication of a result of the error check.

17. The sensor of claim 16, wherein the output includes sensor information from the first signal when the result of the error check is a determination that an error event has not occurred.

18. The sensor of claim 16, wherein the output does not include sensor information from the first signal when the result of the error check is a determination that an error event has occurred.

19. The sensor of claim 16, wherein the output is a protocol-based message that comprises one or more bits carrying the indication of the result of the error check.

20. The sensor of claim 16, wherein the output is a signal provided via an error pin associated with dedicated error signaling.

* * * * *